(12) United States Patent
Minamitani et al.

(10) Patent No.: US 12,494,565 B2
(45) Date of Patent: Dec. 9, 2025

(54) COUPLING STRUCTURE AND ANTENNA MODULE

(71) Applicant: Murata Manufacturing Co., Ltd., Nagaokakyo (JP)

(72) Inventors: Natsumi Minamitani, Nagaokakyo (JP); Kengo Onaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 175 days.

(21) Appl. No.: 18/482,121

(22) Filed: Oct. 6, 2023

(65) Prior Publication Data

US 2024/0039143 A1    Feb. 1, 2024

Related U.S. Application Data

(63) Continuation of application No. PCT/JP2022/007848, filed on Feb. 25, 2022.

(30) Foreign Application Priority Data

Apr. 9, 2021   (JP) .................... 2021-066169

(51) Int. Cl.
*H01Q 1/42*   (2006.01)
*H01Q 1/22*   (2006.01)
*H01Q 21/00*   (2006.01)

(52) U.S. Cl.
CPC .......... *H01Q 1/2283* (2013.01); *H01Q 1/422* (2013.01); *H01Q 21/0087* (2013.01)

(58) Field of Classification Search
CPC .. H01Q 1/2283; H01Q 1/422; H01Q 21/0087; H01Q 9/0407; H01Q 9/285;

(Continued)

(56) References Cited

U.S. PATENT DOCUMENTS 6,246,013 B1 *   6/2001   Yoshida ............... H03H 9/0557
                                                                    174/541
6,400,234 B1 *   6/2002   Ohhashi ............... H01R 12/523
                                                                    333/260

(Continued)

FOREIGN PATENT DOCUMENTS

CN        1512579 A  *   7/2004   ............. H01L 24/73
JP        2019204937 A *   11/2019
WO        2009/113202 A1      9/2009

OTHER PUBLICATIONS

International Search Report and Written Opinion mailed on May 17, 2022, received for PCT Application PCT/JP2022/007848, filed on Feb. 25, 2022, 8 pages including English Translation.

*Primary Examiner* — Dameon E Levi
*Assistant Examiner* — Jordan E. DeWitt
(74) *Attorney, Agent, or Firm* — XSENSUS LLP

(57) ABSTRACT

A coupling structure for coupling an antenna substrate and a rigid substrate to each other is provided. The coupling structure includes an antenna substrate and a rigid substrate. The antenna substrate includes a dielectric and an antenna electrode, and the rigid substrate includes a dielectric and a wiring electrode, the dielectric including a plurality of laminated dielectric layers. The antenna electrode is electrically coupled to the wiring electrode. The dielectric includes an upper surface and a bottom surface that are perpendicular to the lamination direction and holds the dielectric, part of the dielectric being located between the upper surface and the bottom surface. The antenna electrode has a first recess the area of which overlaps the wiring electrode in plan view in the lamination direction.

20 Claims, 12 Drawing Sheets

(58) Field of Classification Search
CPC ............. H01Q 21/0075; H01Q 21/062; H01Q 21/065; H01P 1/047; H05K 1/14; H05K 2201/09036; H05K 2201/09072; H05K 1/183; H05K 2201/09472; H05K 2201/09745; H05K 3/36
USPC ............... 361/762, 790, 795, 799, 814, 749; 174/254, 255, 256, 257, 258
See application file for complete search history.

(56) References Cited

U.S. PATENT DOCUMENTS

| | | | |
|---|---|---|---|
| 6,445,345 B1* | 9/2002 | Kamimoto | H05K 1/024 343/878 |
| 6,518,864 B1* | 2/2003 | Ito | H01P 3/003 333/246 |
| 7,168,960 B1 | 1/2007 | Ju | |
| 8,569,080 B2* | 10/2013 | Chen | H10H 20/8582 438/42 |
| 9,310,393 B2* | 4/2016 | Yoda | G01P 15/0802 |
| 9,673,179 B1* | 6/2017 | Huber | H05K 1/181 |
| 10,216,023 B2* | 2/2019 | Namkung | G02F 1/133305 |
| 10,772,204 B2* | 9/2020 | Baba | H05K 1/181 |
| 10,825,883 B2* | 11/2020 | Tokuda | H10K 59/123 |
| 10,879,316 B2* | 12/2020 | Lee | H10K 59/40 |
| 11,792,923 B2* | 10/2023 | Chang | H05K 1/14 361/749 |
| 2005/0236179 A1* | 10/2005 | Hashimoto | H05K 3/368 174/262 |
| 2010/0230148 A1* | 9/2010 | Kariya | H01L 23/5387 427/97.1 |
| 2011/0194262 A1* | 8/2011 | Naganuma | H05K 3/4691 174/254 |
| 2013/0329370 A1* | 12/2013 | Gottwald | H05K 7/20427 361/720 |
| 2015/0103499 A1* | 4/2015 | Gouchi | H05K 1/0293 361/746 |
| 2015/0145745 A1* | 5/2015 | Nguyen | H01Q 21/0075 333/26 |
| 2015/0180110 A1* | 6/2015 | Swarup | H01P 5/08 333/33 |
| 2015/0191012 A1* | 7/2015 | Yoshiike | H05K 1/0284 174/250 |
| 2015/0208512 A1* | 7/2015 | Akita | H05K 3/0097 29/852 |
| 2015/0349042 A1* | 12/2015 | Hwang | H05K 1/147 174/254 |
| 2016/0006131 A1* | 1/2016 | Matsumura | H01Q 1/2283 343/834 |
| 2016/0066409 A1* | 3/2016 | Kwon | H10K 77/111 174/254 |
| 2016/0095208 A1* | 3/2016 | Kim | C23F 1/02 216/13 |
| 2016/0190052 A1* | 6/2016 | Ruben | H01L 21/4853 174/262 |
| 2017/0309582 A1* | 10/2017 | Meyer | H01L 24/20 |
| 2017/0339781 A1* | 11/2017 | Yamauchi | H05K 1/0224 |
| 2018/0191054 A1* | 7/2018 | Ndip | H01Q 23/00 |
| 2018/0213643 A1* | 7/2018 | Adachi | H05K 3/4644 |
| 2018/0220526 A1* | 8/2018 | Gottwald | H05K 1/185 |
| 2019/0079163 A1* | 3/2019 | Liu | G01S 13/04 |
| 2019/0121209 A1* | 4/2019 | Izawa | H10D 86/481 |
| 2019/0148853 A1* | 5/2019 | Heilemann | H05K 3/34 174/255 |
| 2019/0173176 A1* | 6/2019 | Kim | H01Q 21/062 |
| 2019/0246495 A1* | 8/2019 | Kawazu | H05K 1/0243 |
| 2019/0252772 A1* | 8/2019 | Ndip | H01Q 1/02 |
| 2019/0357360 A1* | 11/2019 | Doyle | H05K 3/0017 |
| 2019/0393391 A1* | 12/2019 | Shiota | H10H 20/857 |
| 2020/0052083 A1* | 2/2020 | Miyamoto | G02F 1/1345 |
| 2020/0176859 A1* | 6/2020 | Furlan | H01Q 1/1271 |
| 2020/0312798 A1* | 10/2020 | Kawahata | G01S 7/03 |
| 2020/0335483 A1* | 10/2020 | Arutinov | H01L 25/0753 |
| 2020/0381843 A1* | 12/2020 | Murata | H01Q 1/243 |
| 2022/0216591 A1* | 7/2022 | Sakaida | H05K 1/02 |
| 2022/0368031 A1* | 11/2022 | Gouchi | H01Q 1/2283 |
| 2023/0049446 A1* | 2/2023 | Kim | H10H 20/857 |
| 2023/0307819 A1* | 9/2023 | Kim | H01Q 21/08 |
| 2023/0402410 A1* | 12/2023 | Acar | H01L 25/16 |
| 2024/0039143 A1* | 2/2024 | Minamitani | H01Q 21/0087 |
| 2024/0347908 A1* | 10/2024 | Liu | H01Q 1/422 |
| 2024/0413526 A1* | 12/2024 | Saito | H01Q 1/38 |

* cited by examiner

COUPLING STRUCTURE AND ANTENNA MODULE

CROSS-REFERENCE TO RELATED APPLICATIONS

This is a continuation application of PCT/JP2022/007848, filed on Feb. 25, 2022, designating the United States of America, which is based on and claims priority to Japanese Patent Application No. JP 2021-066169 filed on Apr. 9, 2021. The entire contents of the above-identified applications, including the specifications, drawings and claims, are incorporated herein by reference in their entirety.

TECHNICAL FIELD

The present disclosure relates to a coupling structure and an antenna module and more specifically to a technology for improving the strength of coupling between two substrates included in an antenna module.

BACKGROUND ART

International Publication No. WO2009/113202 (Patent Document 1) discloses a coupling structure for coupling a multilayer substrate and a flexible substrate.

In a coupling structure disclosed in Patent Document 1, the flexible substrate is coupled to the multilayer substrate with an end portion of the flexible substrate embedded into the multilayer substrate. The flexible substrate having flexibility bends in a coupled state. In the coupling structure in Patent Document 1, since the end portion of the flexible substrate is embedded into the multilayer substrate, when the flexible substrate bends, the stress caused by bending does not affect the coupling portion between the electrode of the multilayer substrate and the electrode of the flexible substrate. Patent Document 1 indicates that this configuration increases the reliability of coupling between the multilayer substrate and the flexible substrate.

CITATION LIST

Patent Document

Patent Document 1: International Publication No. WO2009/113202

SUMMARY OF DISCLOSURE

Technical Problem

However, in the coupling structure of Patent Document 1, if the degree of adhesion between the coupled substrates is low, when a force is applied to one of the substrates in a direction in which the one of the substrates is pulled out from the coupling portion, in other words, in the extending direction of the substrate, the coupling between the two substrates can break.

The present disclosure has been made to solve such a problem, and an object thereof is to improve, in a coupling structure for coupling two substrates, the strength of coupling between the coupled substrates in a case in which a force is applied to one of the substrates in a direction in which the substrate is pulled out from the coupling portion.

Solution to Problem

A coupling structure according to an aspect of the present disclosure is a coupling structure for coupling a first substrate and a second substrate to each other. The coupling structure includes a first substrate and a second substrate. The first substrate includes a first dielectric and a first electrode, and the second substrate includes a second dielectric and a second electrode. The second dielectric including a plurality of laminated dielectric layers. The first electrode is electrically coupled to the second electrode. The second dielectric has a first surface and a second surface perpendicular to a lamination direction of the second dielectric. The second dielectric holds the first dielectric. Part of the first dielectric is located between the first surface and the second surface. The first electrode has a first recess the area of which overlaps the second electrode in plan view in the lamination direction.

In the coupling structure of the present disclosure, the first electrode included in the first substrate has the first recess the area of which overlaps the second electrode included in the second substrate in plan view in the lamination direction of the second dielectric. In this structure, the contact area between the two substrates is larger than in a coupling structure without a recess in the area of the first electrode described above, which increases the degree of adhesion and improves the strength of coupling between the substrates.

DESCRIPTION OF EMBODIMENTS

Hereinafter, embodiments of the present disclosure will be described in detail with reference to the drawings. Note that the same or similar portions in the figures are denoted by the same symbols without repetitive description thereof.

Embodiment 1

(Basic Configuration of Communication Device)

Figure 1:
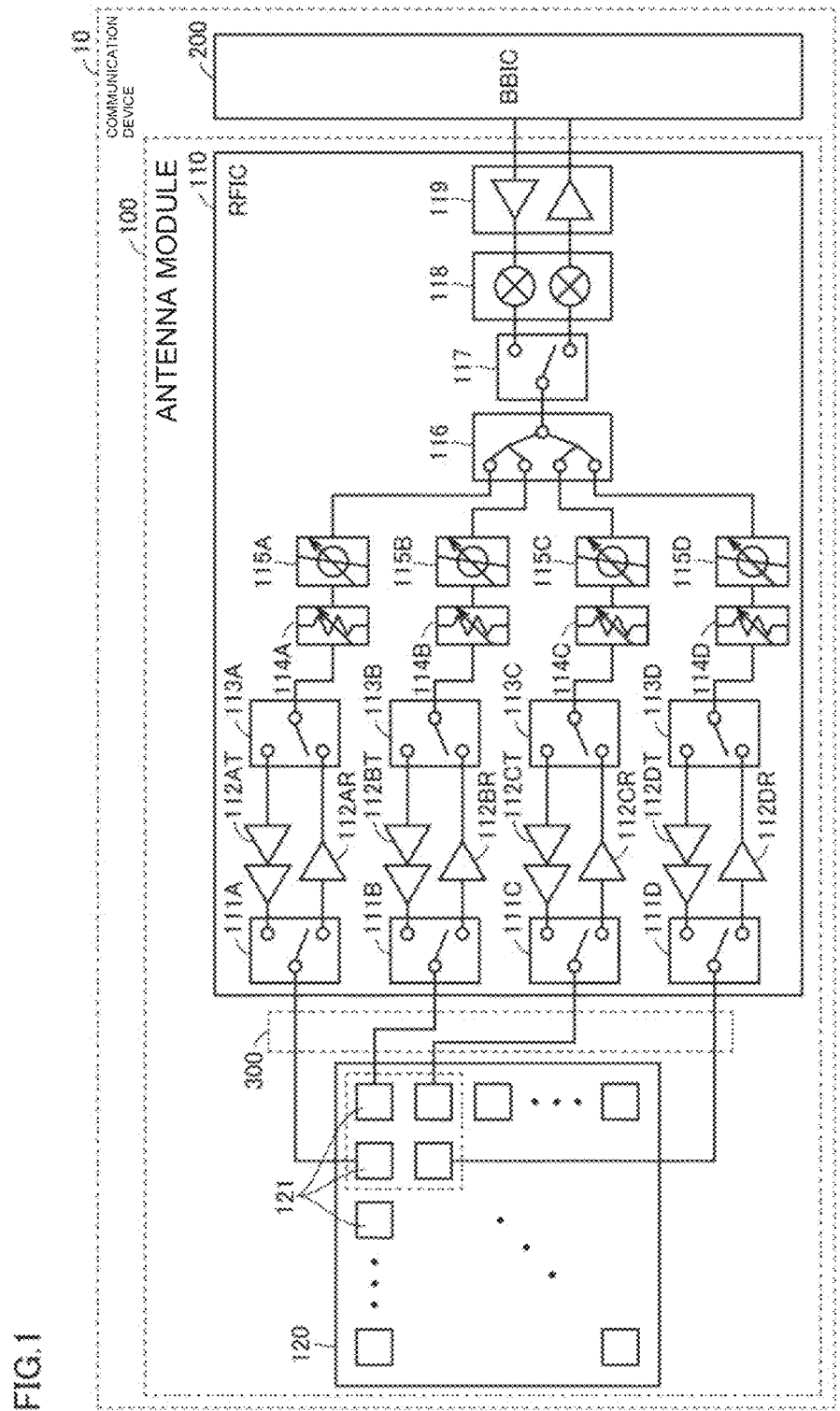
FIG. 1 illustrates an example of a block diagram of a communication device according to Embodiment 1.

FIG. 1 illustrates an example of a block diagram of a communication device 10 according to Embodiment 1. The communication device 10 is, for example, a mobile terminal such as a mobile phone, a smartphone, or a tablet computer; a personal computer with a communication function; a base station; or the like. An example of the frequency band of the radio waves used in an antenna module 100 according to Embodiment 1 is, for example, radio waves of a millimeter wave band with a center frequency of 28 GHz, 39 GHz, 60 GHz or the like. However, the present disclosure is applicable to radio waves of frequency bands other than the above.

With reference to FIG. 1, the communication device 10 includes the antenna module 100 and a BBIC 200 serving as a base-band signal processing circuit. The antenna module 100 includes an RFIC 110, which is an example of a feeding circuit, and an antenna substrate 120. The communication device 10 upconverts the signal transmitted from the BBIC 200 to the antenna module 100 into a radio-frequency signal in the RFIC 110, and the upconverted signal passes through a rigid substrate 300 and is radiated from the antenna substrate 120. The communication device 10 receives radio-frequency signals at the antenna substrate 120, transmits the received signals through the rigid substrate 300 to the RFIC 110, down converts the signals, and then processes the signals at the BBIC 200.

FIG. 1 illustrates, to simplify explanation, a configuration corresponding to four radiation electrodes 121 out of a plurality of radiation electrodes 121 included in the antenna substrate 120, and illustration of a configuration corresponding to other radiation electrodes 121 having the same or a similar configuration is omitted. Although FIG. 1 illustrates an example of the antenna substrate 120 including the plurality of two-dimensionally arrayed radiation electrodes 121, the number of radiation electrodes 121 does not have to be two or more. A configuration with an antenna substrate 120 including one radiation electrode 121 is possible. Alternatively, a plurality of radiation electrodes 121 may be linearly aligned as a one-dimensional array. Although the description of Embodiment 1 is based on an example in which the radiation electrode 121 is a patch antenna having an approximately square flat plate shape, the shape of the radiation electrode 121 may also be circular, elliptical, or polygonal, such as hexagonal.

The RFIC 110 includes switches 111A to 111D, 113A to 113D, and 117, power amplifiers 112AT to 112DT, low-noise amplifiers 112AR to 112DR, attenuators 114A to 114D, phase shifters 115A to 115D, a signal multiplexer/demultiplexer 116, a mixer 118, and an amplifier circuit 119.

To transmit a radio-frequency signal, the switches 111A to 111D and 113A to 113D are switched to the power amplifiers 112AT to 112DT sides, and, in addition, the switch 117 is coupled to a transmission amplifier of the amplifier circuit 119. To receive a radio-frequency signal, the switches 111A to 111D and 113A to 113D are switched to the low-noise amplifiers 112AR to 112DR sides, and, in addition, the switch 117 is coupled to a reception amplifier of the amplifier circuit 119.

The signal transmitted from the BBIC 200 is amplified by the amplifier circuit 119 and is upconverted by the mixer 118. The transmission signal which is the upconverted radio-frequency signal is demultiplexed by the signal multiplexer/demultiplexer 116 into four signals, which pass through four signal paths and are fed to the different respective radiation electrodes 121. In this operation, the degree of the phase shift of each of the phase shifters 115A to 115D located on the corresponding signal path is individually adjusted so that it is possible to adjust the directivity of the antenna substrate 120. The attenuators 114A to 114D are used to adjust the strength of the transmission signals.

The reception signal received by each radiation electrode 121, which is a radio-frequency signal, passes through the corresponding one of the four different signal paths and is multiplexed by the signal multiplexer/demultiplexer 116. The multiplexed reception signal is down converted by the mixer 118, amplified by the amplifier circuit 119, and transmitted to the BBIC 200.

The RFIC 110 is, for example, a one-chip integrated circuit component including the above circuit configuration. Alternatively, the elements (the switches, the power amplifier, the low-noise amplifier, the attenuator, and the phase shifter) associated with a corresponding radiation electrode 121 in the RFIC 110 may be formed as a one-chip integrated circuit component for the corresponding radiation electrode 121.

(Structure for Coupling Antenna Substrate and Wiring Substrate)

Figure 2:
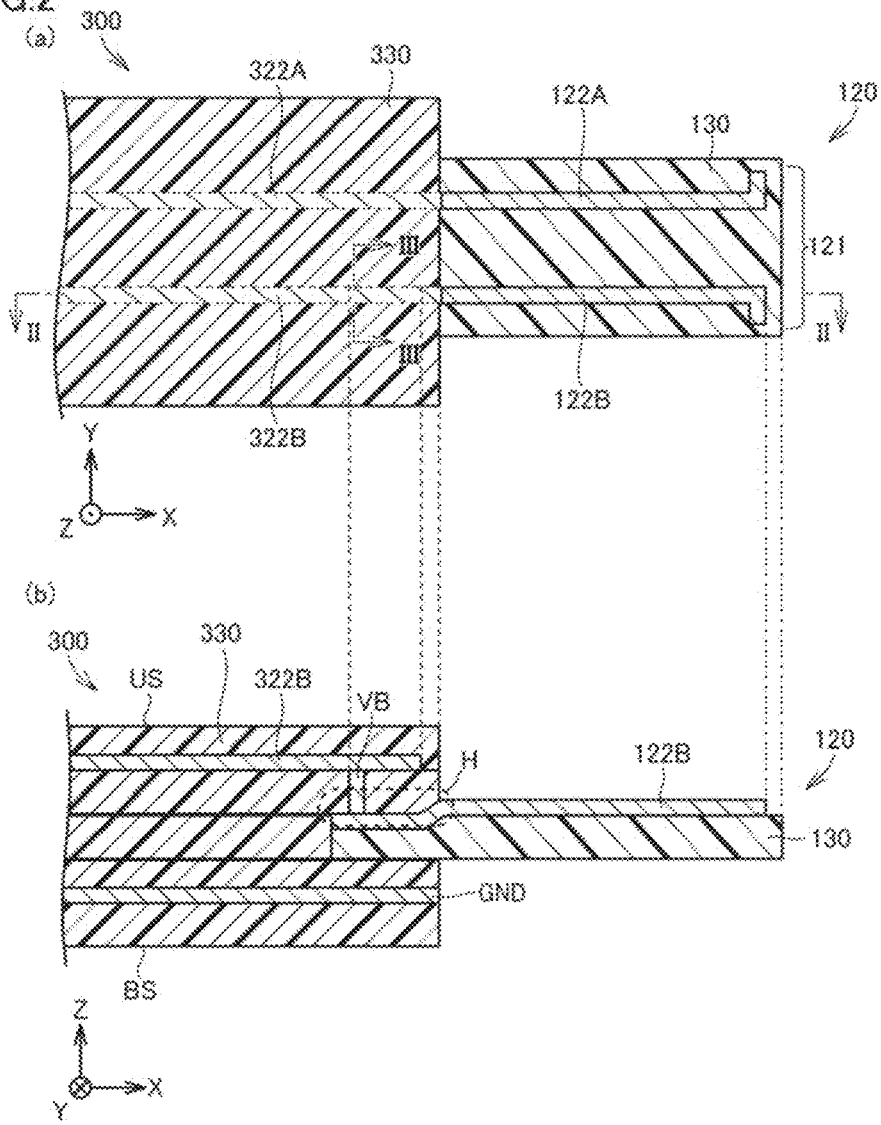
FIG. 2 illustrates a plan view and a sectional view of a portion coupling an antenna substrate and a rigid substrate according to Embodiment 1.

Next, with reference to FIGS. 2 to 4, details of a structure for coupling the antenna substrate 120 and the rigid substrate 300 illustrated in FIG. 1 will be described. FIG. 2 illustrates a plan view (FIG. 2(a)) of a portion coupling the antenna substrate 120 and the rigid substrate 300 and a sectional view (FIG. 2(b)) taken along line II-II in FIG. 2(a).

Figure 3:
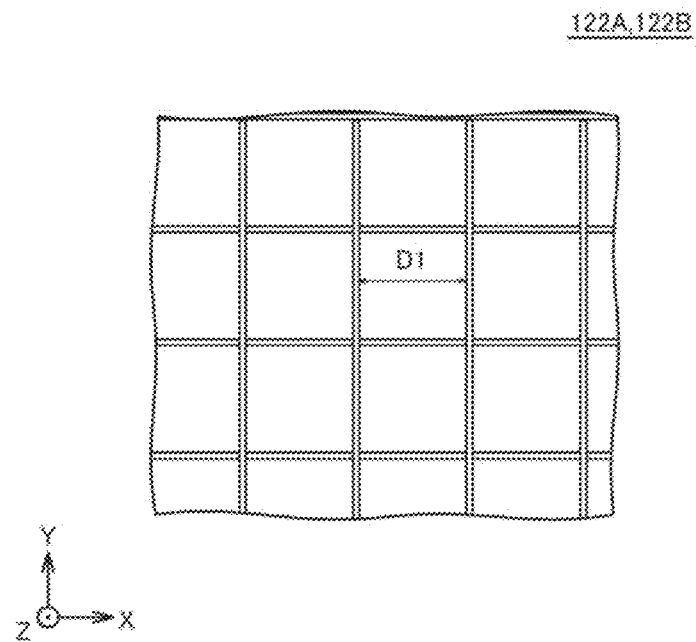
FIG. 3 is an enlarged view of antenna electrodes of the antenna substrate according to Embodiment 1 viewed in the positive Z-axis direction.

FIG. 3 is an enlarged view of antenna electrodes 122A and 122B of the antenna substrate 120 in plan view in the positive Z-axis direction. FIG. 4 is a sectional view taken along line III-III in FIG. 2(a). FIGS. 2 to 4 illustrate a case in which the antenna substrate 120 serves as a dipole antenna.

Note that in the following description, the thickness direction of the antenna substrate 120 is defined as the Z-axis direction, and the plane perpendicular to the Z-axis direction is defined by the X-axis and the Y-axis. The positive Z-axis direction and the negative Z-axis direction in each figure are sometimes referred to as the upper surface side and the bottom surface side, respectively. The antenna substrate 120 corresponds to a first substrate in the present disclosure, and the rigid substrate 300 corresponds to a second substrate in the present disclosure.

With reference to FIGS. 2(a) and 2(b), the antenna substrate 120 is coupled to the rigid substrate 300. The antenna substrate 120 includes a dielectric 130 and the antenna electrodes 122A and 122B. The rigid substrate 300 includes a dielectric 330, wiring electrodes 322A and 322B, and a ground electrode GND. The dielectric 330 includes a plurality of dielectric layers laminated in the Z-axis direction. The dielectric layers included in the dielectric 330 are composed of, for example, a liquid crystal polymer (LCP). Note that the dielectric 330 corresponds to a second dielectric in the present disclosure.

In the coupling structure illustrated in Embodiment 1, the antenna substrate 120 and the rigid substrate 300 are fired by compression and heating, causing these substrates to adhere to each other. With this process, the antenna substrate 120 and the rigid substrate 300 are coupled to each other.

The thickness (the dimension in the Z-axis direction) of the dielectric 130 of the antenna substrate 120 is less than the thickness of the dielectric 330 of the rigid substrate 300. With reference to FIG. 2(b), the dielectric 330 has an upper surface US and a bottom surface BS that are perpendicular to the lamination direction of the dielectric. Part of the antenna substrate 120 is located between the upper surface US of the dielectric 330 and the bottom surface BS of the dielectric 330. Specifically, in the coupling structure in FIG. 2, the antenna substrate 120 is coupled to the rigid substrate 300 with an end portion of the antenna substrate 120 in the negative X-axis direction embedded into the rigid substrate 300.

The upper surface US of the dielectric 330 corresponds to a first surface in the present disclosure, and the bottom surface BS of the dielectric 330 corresponds to a second surface in the present disclosure.

In the antenna substrate 120, the antenna electrodes 122A and 122B are located on the surface of the dielectric 130 facing the positive Z-axis direction. An end portion of each of the antenna electrodes 122A and 122B in the positive X-axis direction functions as a radiation electrode 121. Specifically, the antenna electrodes 122A and 122B are differentially fed by the RFIC 110 and serve as a dipole antenna that radiates radio waves from the radiation electrode 121.

Each of the antenna electrodes 122A and 122B has a mesh shape in plan view in the positive Z-axis direction. The mesh shape of each of the antenna electrodes 122A and 122B will be described with reference to FIG. 3. As illustrated in FIG. 3, the antenna electrodes 122A and 122B are formed such that a plurality of linear conductors are woven. The distance D1 between the linear conductors is 50 to 100 μm. The width of one linear conductor, in other words, the thickness of a linear conductor, is 1 to 2 μm. As described above, since the antenna electrodes 122A and 122B are narrow woven linear conductors, the antenna electrodes 122A and 122B enable most of light received on the negative Z-axis direction side to pass therethrough to the positive Z-axis direction side without blocking the light. Note that the antenna electrode 122A or the antenna electrode 122B corresponds to a first electrode in the present disclosure.

With reference to FIG. 2 again, the dielectric 130 is, for example, a film composed of a polyethylene terephthalate (PET) material having a light transmitting property. With this configuration, the antenna substrate 120 according to Embodiment 1 enables most of light received on the negative Z-axis direction side of the dielectric 130 to pass therethrough to the positive Z-axis direction side.

Specifically, in a case in which the communication device 10 is a mobile terminal such as a smartphone and the antenna substrate 120 is located and overlaps a display, this configuration does not hinder the user from seeing the display through the antenna substrate 120. In other words, the antenna electrodes 122A and 122B are less likely to be visible to the naked eye. The dielectric 130 of the antenna substrate 120 may be a multilayer substrate. Note that the dielectric 130 corresponds to a first dielectric in the present disclosure.

The dielectric 130 or the dielectric 330 may be, for example, a low-temperature co-fired ceramic (LTCC) multilayer substrate, a multilayer resin substrate including a plurality of laminated resin layers composed of a resin such as epoxy resin or polyimide resin, a multilayer resin substrate including a plurality of laminated resin layers composed of a liquid crystal polymer (LCP) having lower permittivity, a multilayer resin substrate including a plurality of laminated resin layers composed of a fluororesin, or a ceramic multilayer substrate other than an LTCC. The dielectric 130 or the dielectric 330 may be formed of glass or plastic.

FIG. 2(b) illustrates a cross section taken along line II-II to explain the coupling between the wiring electrode 322B and the antenna electrode 122B. The wiring electrodes 322A and 322B and the ground electrode GND are located inside the rigid substrate 300. With reference to FIG. 2(b), the ground electrode GND, the antenna substrate 120, and the wiring electrodes 322A and 322B are located in the rigid substrate 300 in this order from the negative Z-axis direction side.

Although the structure for coupling the wiring electrode 322A and the antenna electrode 122A is not illustrated, the wiring electrode 322A and the antenna electrode 122A have a coupling structure the same as or similar to the structure for coupling the wiring electrode 322B and the antenna electrode 122B illustrated in FIG. 2(b). Although the ground electrode GND is not illustrated in FIG. 2(a), the ground electrode GND is a flat-plate electrode having a plane parallel to the XY-plane and overlapping both the wiring electrodes 322A and 322B in plan view in the Z-axis direction.

As illustrated in FIG. 2(b), the wiring electrode 322B and the antenna electrode 122B are coupled by a via VB. In other words, the wiring electrodes 322A and 322B are electrically coupled to the antenna electrodes 122A and 122B, respectively, with vias interposed therebetween.

The ground electrode GND serves as a reference potential. With respect to the reference potential of the ground electrode GND, impedances of the wiring electrodes 322A and 322B and the antenna electrodes 122A and 122B are 50Ω.

As illustrated in FIG. 2(b), the antenna electrode 122B descends in the negative Z-axis direction while extending inward from an outer portion of the rigid substrate 300 and further extends. In other words, the antenna electrode 122B has a recess H. The recess H is formed in an area overlapping the wiring electrode 322B in plan view in the lamination direction of the dielectric 330. The recess H of the antenna electrode 122B corresponds to a first recess in the present disclosure.

Figure 4:
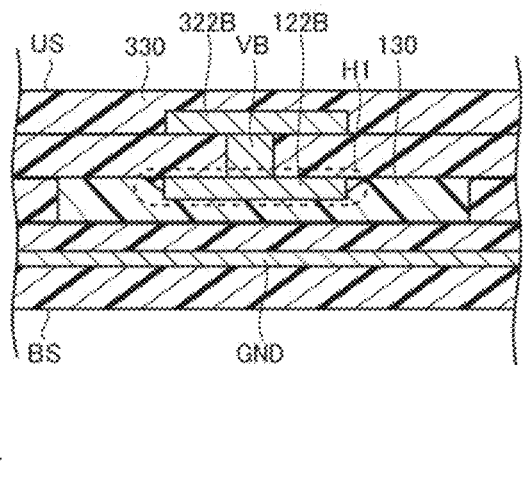
FIG. 4 is a sectional view of the antenna substrate and the rigid substrate according to Embodiment 1.

FIG. 4 illustrates a cross section of the rigid substrate 300 taken along line III-III in FIG. 2(a) and illustrates a portion after the antenna electrode 122B descends in the negative Z-axis direction. In the cross section taken along line III-III in FIG. 2(a), the dielectric 330 of the rigid substrate 300 includes the ground electrode GND, the dielectric 130, the antenna electrode 122B, the via VB, and the wiring electrode 322B in this order from the negative Z-axis direction side.

Since the antenna electrode 122B has the recess H, the antenna electrode 122B extends while descending in the negative Z-axis direction. Hence, the dielectric 130 has a recess H1 recessed in the negative Z-axis direction conforming to the descending portion of the antenna electrode 122B. The antenna electrode 122B is located so as to be in contact with a surface of the dielectric 130, the surface forming the recess H1. In Embodiment 1, the recess H1 is recessed by half the thickness (the dimension in the Z-axis direction) of the dielectric 130.

In a coupling structure in which one substrate is coupled to the other substrate with part of the one substrate embedded into the other substrate as illustrated in Embodiment 1, if the degree of adhesion between the substrates is weak, there is a possibility that the coupling between the substrates can break when a pulling force is applied to one of the substrates in the extending direction thereof.

In the coupling structure according to Embodiment 1, since the antenna electrode 122B has the recess H as illustrated in FIG. 2(b), the contact area between the antenna electrode 122B and the dielectric 330 is larger than in a case in which the antenna electrode 122B is a flat plate. Hence, this configuration in the coupling structure according to Embodiment 1 improves the degree of adhesion between the antenna electrode 122B and the dielectric 330 by compression and heating in the manufacturing stage.

In addition, since the antenna electrode 122B has the recess H, the dielectric 130 has the recess H1, which increases the contact area between the dielectric 130 and the dielectric 330. This configuration in the coupling structure according to Embodiment 1 improves the degree of adhesion between the dielectric 130 and the dielectric 330 by compression and heating in the manufacturing stage.

The dielectric 130 has the recess H1 the area of which overlaps the wiring electrode 322B and the antenna electrode 122B in plan view in the lamination direction of the dielectric 330. In other words, in the coupling structure according to Embodiment 1, formation of the recess H1 causes the antenna electrode 122B to be compressed so as to be pushed into the dielectric 130 in the manufacturing stage, increasing the contact area between the antenna electrode 122B and the dielectric 130. This configuration in the coupling structure according to Embodiment 1 improves the degree of adhesion between the dielectric 130 and the dielectric 330 as well as the degree of adhesion between the dielectric 130 and the antenna electrode 122B.

As described above, the coupling structure according to Embodiment 1 improves the degree of adhesion between the antenna electrode 122B and the dielectric 330 and also improves the degree of adhesion between the dielectric 130 and the dielectric 330 and between the dielectric 130 and the antenna electrode 122B, which improves the coupling strength between the substrates. In other words, in the coupling structure according to Embodiment 1, when a pulling force in the positive X-axis direction is applied to the antenna substrate 120, the coupling between the antenna substrate 120 and the rigid substrate 300 is less likely to break compared with a coupling structure in which the dielectric 130 does not have the recess H and the recess H1.

Embodiment 2

A description has been given of the coupling structure of Embodiment 1 in which the antenna electrode 122B and the dielectric 130 of the antenna substrate 120 have recesses. Embodiment 2 describes an example in which the bottom surface of a dielectric 130A has a protrusion, and a ground electrode GNDA has a recess.

Figure 5:
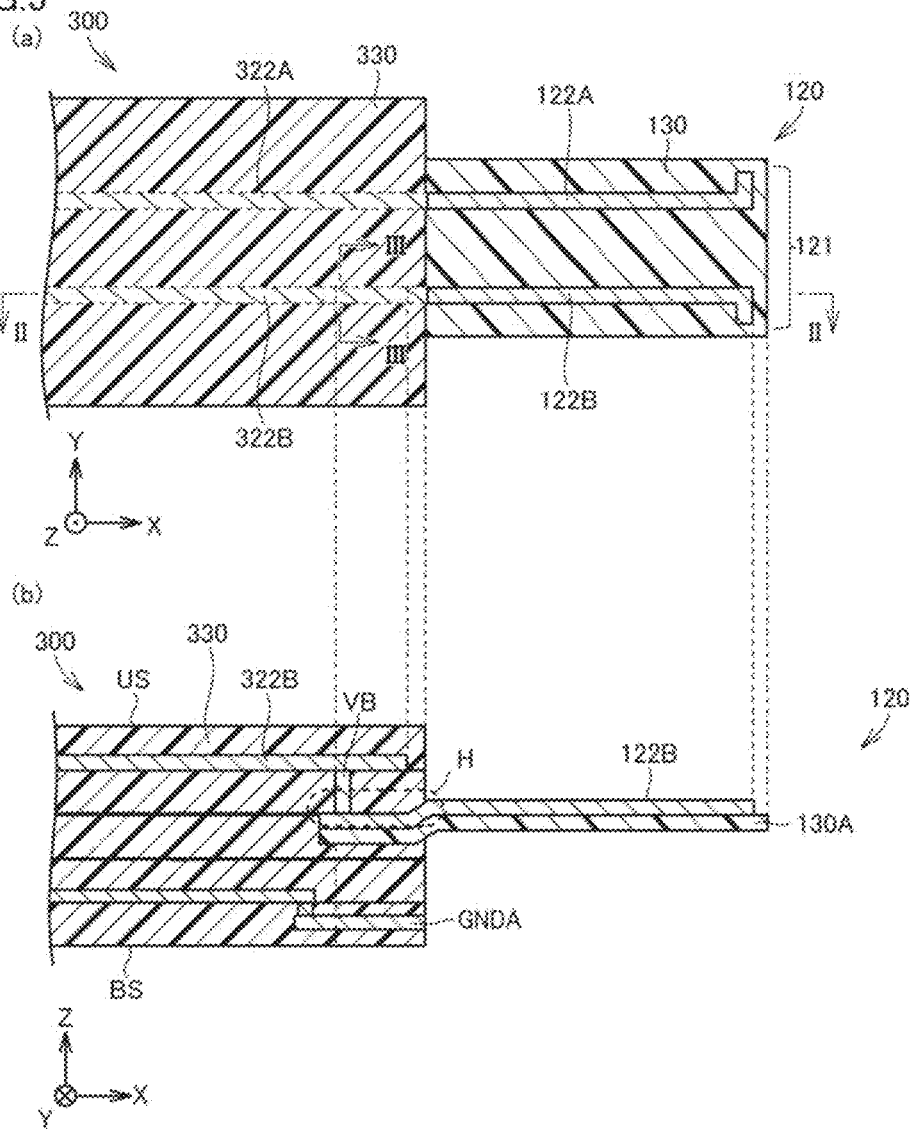
FIG. 5 illustrates a plan view and a sectional view of a portion coupling an antenna substrate and a rigid substrate according to Embodiment 2.
Figure 6:
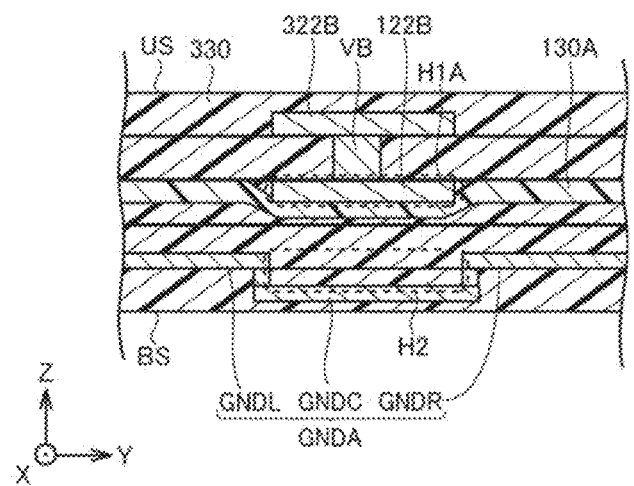
FIG. 6 is a sectional view of the antenna substrate and the rigid substrate according to Embodiment 2.

With reference to FIGS. 5 and 6, details of a structure for coupling an antenna substrate 120 and a rigid substrate 300 according to Embodiment 2 will be described. FIG. 5 illustrates a plan view (FIG. 5(a)) of a portion coupling the antenna substrate 120 and the rigid substrate 300 and a sectional view (FIG. 5(b)) taken along line II-II in FIG. 5(a). FIG. 6 is a sectional view taken along line III-III in FIG. 5(a).

Note that in FIGS. 5 and 6, the shapes of the dielectric 130 and the ground electrode GND are modified from those in in FIGS. 2 and 4 illustrating Embodiment 1, and the other portions are the same or similar. In FIGS. 5 and 6, repetitive description of the elements the same as or similar to those in FIGS. 2 and 4 for Embodiment 1 is omitted.

With reference to FIG. 6, the dielectric 130A has a protrusion on the bottom surface of the dielectric 130A at the position corresponding to a recess formed in the upper surface. With reference to FIG. 5(b), as with the antenna electrode 122B, the dielectric 130A descends in the negative Z-axis direction while extending inward from an outer portion of the rigid substrate 300 and further extends. Since the bottom surface of the dielectric 130A has the protrusion, a recess H1A is formed to have a depth the same as the thickness (the dimension in the Z-axis direction) of the dielectric 130.

In other words, the contact area between the dielectric 130A and the dielectric 330 is larger and the dielectric 130A can be thinner than in the coupling structure of Embodiment 1. Accordingly, this configuration further improves the degree of adhesion between the dielectric 130A and the dielectric 330 by compression and heating in the manufacturing stage. The recess H1A may be deeper than the thickness of the dielectric 130A. For example, the recess H1A may be formed to have a depth twice the thickness of the dielectric 130A.

The following describes a recess H2 formed in the ground electrode GNDA. The ground electrode GNDA included in the rigid substrate 300 of Embodiment 2 has the recess H2 the area of which overlaps the antenna electrode 122B and the wiring electrode 322B in plan view in the lamination direction of the dielectric 330. In other words, the recess H2 is located in an area of the ground electrode GNDA, the area overlapping the recess H1A in plan view in the Z-axis direction.

As with the recess H1A, the recess H2 is recessed in the negative Z-axis direction. In other words, the recess H2 is recessed in the same direction as the recess H1A is recessed. Note that the recess H2 in Embodiment 2 corresponds to a second recess in the present disclosure.

The ground electrode GNDA includes a ground electrode GNDL, a ground electrode GNDC, and a ground electrode GNDR. The ground electrode GNDC overlaps the antenna electrode 122B and the wiring electrode 322B in plan view in the lamination direction. The ground electrode GNDL and the ground electrode GNDR do not overlap the antenna electrode 122B and the wiring electrode 322B in plan view in the lamination direction.

With reference to FIG. 6, the ground electrode GNDC is formed in the dielectric layer having the bottom surface BS out of the dielectric layers forming the dielectric 330. In other words, the ground electrode GNDC is formed inside the dielectric layer located on the most negative side in the Z-axis direction. In contrast, the ground electrode GNDL and the ground electrode GNDR are located in the dielectric layer on the positive Z-axis direction side of the dielectric layer in which the ground electrode GNDC is located. In other words, the dielectric layer in which the ground electrode GNDC is located is different from the dielectric layer in which the ground electrode GNDL and the ground electrode GNDR are located.

The ground electrode GNDC is coupled to the ground electrode GNDL and the ground electrode GNDR with vias interposed therebetween. The method of coupling the ground electrode GNDC and the ground electrodes GNDL and GNDR is not limited to methods using vias. For example, a conductive adhesive or the like may be used for coupling those ground electrodes.

The ground electrode GNDC corresponds to a first ground electrode in the present disclosure. The ground electrode GNDL and the ground electrode GNDR correspond to a second ground electrode in the present disclosure.

This configuration makes it possible to match the impedance between the ground electrode GNDA and the wiring electrode 322B and between the ground electrode GNDA and the antenna electrode 122B more reliably than in the case of the ground electrode GND of Embodiment 1. The antenna electrode 122B and the wiring electrode 322B are electrically coupled to the ground electrode GNDA to transmit radio-frequency signals. Specifically, the antenna electrode 122B and the ground electrode GNDA function as a strip line.

A plurality of electric lines of force are generated between the antenna and wiring electrodes 122B and 322B and the ground electrode GNDA that function as a strip line. In a strip line, it is desirable that the permittivity of the regions that the electric lines of force pass through be uniform when radio-frequency signals are transmitted.

Since the ground electrode GNDA has the recess H2, the ratio of the dielectric 130 and the dielectric 330 that each of the electric lines of force passes through is closer to uniformity. In other words, the difference in the permittivity between the regions that each of the electric lines of force passes through is smaller.

In the coupling structure of Embodiment 2, the ground electrode GNDA has the recess H2 in the area overlapping the recess H1A in plan view in the Z-axis direction. This configuration reduces the difference in the permittivity of the regions that each electric line of force passes through between the antenna electrode 122B and the ground electrode GNDA and between the wiring electrode 322B and the ground electrode GNDA. Thus, it is possible to reliably match the impedance between the ground electrode GNDA and the wiring electrode 322B and between the ground electrode GNDA and the antenna electrode 122B.

Modification 1 of Embodiment 2

Figure 7:
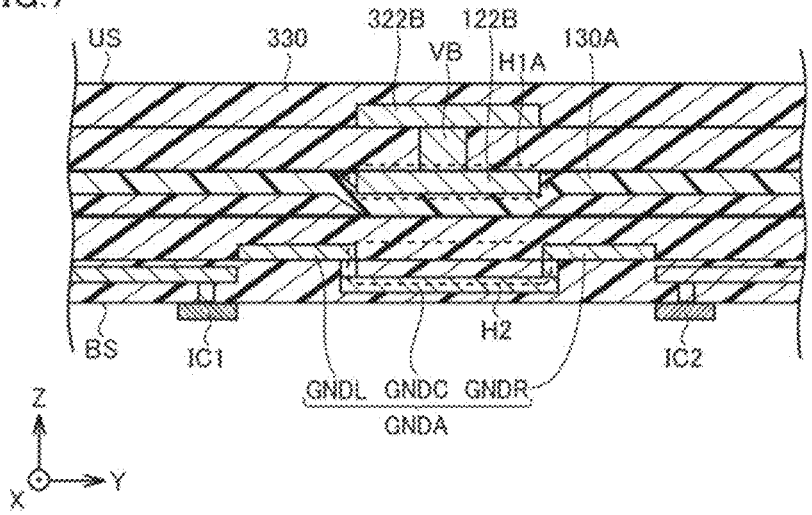
FIG. 7 is a diagram illustrating a structure for coupling an antenna substrate and a rigid substrate according to a first modification of Embodiment 2.

FIG. 7 is a diagram illustrating a structure for coupling an antenna substrate 120 and a rigid substrate 300 according to a first modification of Embodiment 2. In Modification 1 of Embodiment 2, electronic components IC1 and IC2 are mounted on the bottom surface BS of the dielectric 330.

The electronic components IC1 and IC2 are, for example, the RFIC 110, the BBIC 200, or the like. Note that the electronic components IC1 and IC2 may be other electronic components. The electronic components IC1 and IC2 may be mounted on the upper surface US of the dielectric 330. As mentioned above, in Modification 1 of Embodiment 2, any electronic component can be mounted near the coupling portion between the antenna substrate 120 and the rigid substrate 300.

The electronic components IC1 and IC2 are mounted in areas of the bottom surface BS not overlapping the recess H2 in plan view in the Z-axis direction. In the area of the bottom surface BS of the dielectric 330 overlapping the recess H2 of the ground electrode GNDA, there is a possibility that the flatness is not sufficient due to the influence of the recess H2. In a case in which the electronic components IC1 and IC2 are mounted on areas of the bottom surface BS where the flatness is not sufficient, coupling failure of the electronic components IC1 and IC2 can occur.

In the coupling structure illustrated in FIG. 7, since the electronic components IC1 and IC2 are mounted on areas of the bottom surface BS not overlapping the recess H2 in plan view in the Z-axis direction, the electronic components IC1 and IC2 can be mounted on areas having a sufficient flatness, which prevent coupling failure.

Modification 2 of Embodiment 2

Figure 8:
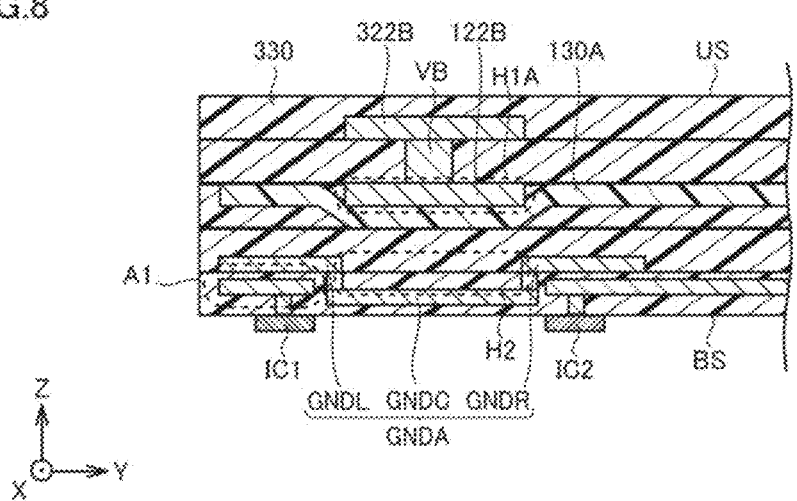
FIG. 8 is a diagram illustrating a structure for coupling an antenna substrate and a rigid substrate according to a second modification of Embodiment 2.

FIG. 8 is a diagram illustrating a structure for coupling an antenna substrate 120 and a rigid substrate 300 according to a second modification of Embodiment 2. In Modification 2 of Embodiment 2, an electronic component IC1 is mounted in an area A1 that does not overlap the recess H2 and overlaps a portion of the ground electrode GNDA where the recess H2 is not formed, in plan view in the Z-axis direction.

As illustrated in FIG. 8, since the ground electrode GNDA has the recess H2, the area A1 is isolated from the other areas of the dielectric 330. In FIG. 8, since the electronic component IC1 is mounted in the isolated area A1, the area A1 can be effectively utilized. In particular, in a case in which an end portion of the ground electrode GNDA in the negative Y-axis direction is close to an end portion of the dielectric 330 in the negative Y-axis direction as illustrated in FIG. 8, mounting electronic components in the area A1 makes it possible to utilize the area A1 more effectively.

Embodiment 3

The above Embodiments 1 and 2 describe configurations in which the antenna electrode 122B and the wiring electrode 322B are coupled with the via VB interposed therebetween. Embodiment 3 describes an example in which an antenna electrode 122B is in direct contact with a wiring electrode 322B.

Figure 9:
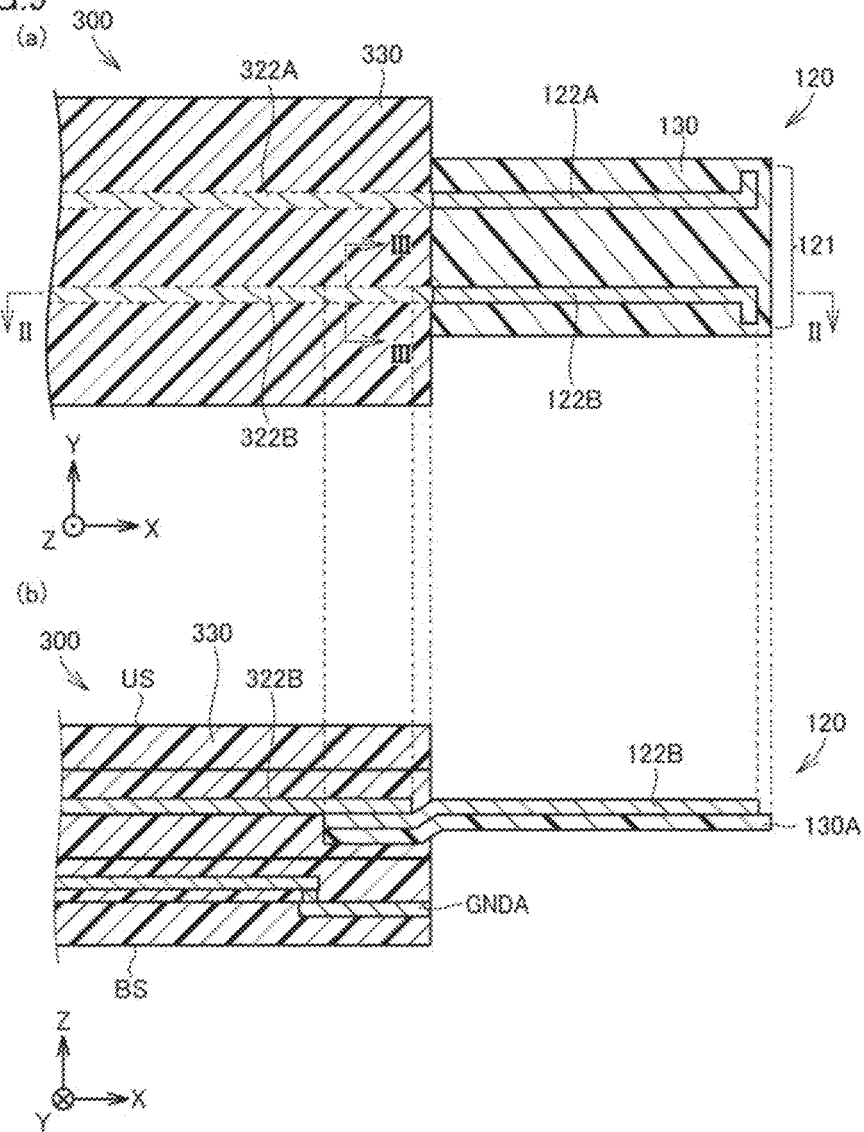
FIG. 9 illustrates a plan view and a sectional view of a portion coupling an antenna substrate and a rigid substrate according to Embodiment 3.
Figure 10:
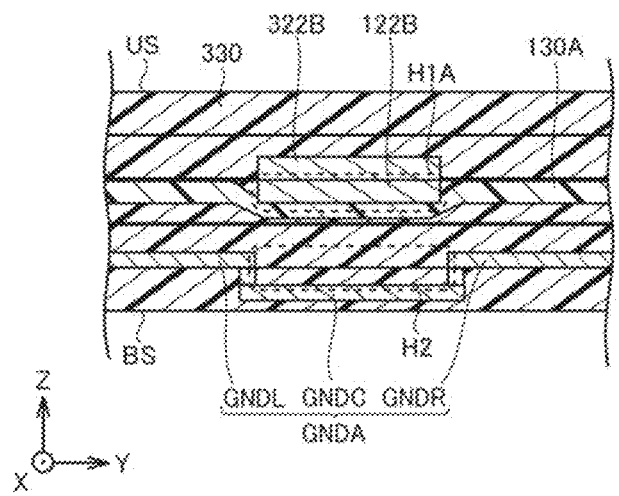
FIG. 10 is a sectional view of the antenna substrate and the rigid substrate according to Embodiment 3.

With reference to FIGS. 9 and 10, details of a structure for coupling an antenna substrate 120 and a rigid substrate 300 according to Embodiment 3 will be described. FIG. 9 illustrates a plan view (FIG. 9(a)) of a portion coupling the antenna substrate 120 and the rigid substrate 300 and a sectional view (FIG. 9(b)) taken along line II-II in FIG. 9(a). FIG. 10 is a sectional view taken along line III-III in FIG. 9(a).

Note that in Embodiment 3, the antenna electrode 122B and the wiring electrode 322B are those in FIGS. 5 and 6 illustrating Embodiment 2 but are electrically coupled without a via VB, and the other portions are the same or similar. In Embodiment 3, repetitive description of the elements the same as or similar to those in FIGS. 5 and 6 for Embodiment 2 is omitted.

The wiring electrode 322B and the antenna electrode 122B are in direct contact with each other without a via. As illustrated in FIGS. 9(b) and 10, the wiring electrode 322B and the antenna electrode 122B are in surface contact with each other. With this configuration, the coupling structure of Embodiment 3 without a via saves costs for coupling the wiring electrode 322B and the antenna electrode 122B. In addition, in the coupling structure of Embodiment 3, increasing the area in which the wiring electrode 322B and the antenna electrode 122B are in surface contact with each other improves the strength of coupling between the wiring electrode 322B and the antenna electrode 122B, which also decreases the resistance of coupling between the wiring electrode 322B and the antenna electrode 122B.

Modification 1 of Embodiment 3

Figure 11:
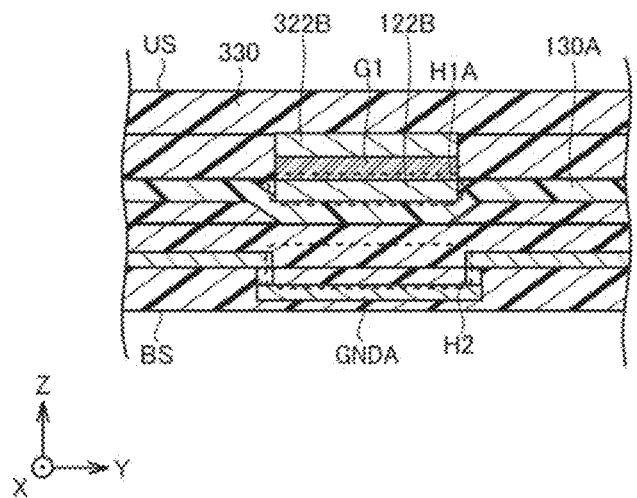
FIG. 11 is a diagram illustrating a structure for coupling an antenna substrate and a rigid substrate according to a first modification of Embodiment 3.

FIG. 11 is a diagram illustrating a structure for coupling an antenna substrate 120 and a rigid substrate 300 according to a first modification of Embodiment 3. In Modification 1 of Embodiment 3, the antenna substrate 120 and the rigid substrate 300 are coupled with a conductive adhesive G1.

With reference to FIG. 11, the conductive adhesive G1 is located between the antenna electrode 122B and the wiring electrode 322B and couples the antenna electrode 122B and the wiring electrode 322B electrically or physically. The conductive adhesive G1 is, for example, an epoxy resin or a silicone resin containing conductive fillers. The conductive adhesive may also be another thermosetting resin or solder.

This configuration according to Modification 1 of Embodiment 3 improves the physical strength of coupling between the antenna electrode 122B and the wiring electrode 322B. In addition, the improved physical coupling strength prevents the occurrence of coupling failure between the antenna electrode 122B and the wiring electrode 322B, resulting in an improvement in the electrical coupling strength.

Modification 2 of Embodiment 3

Figure 12:
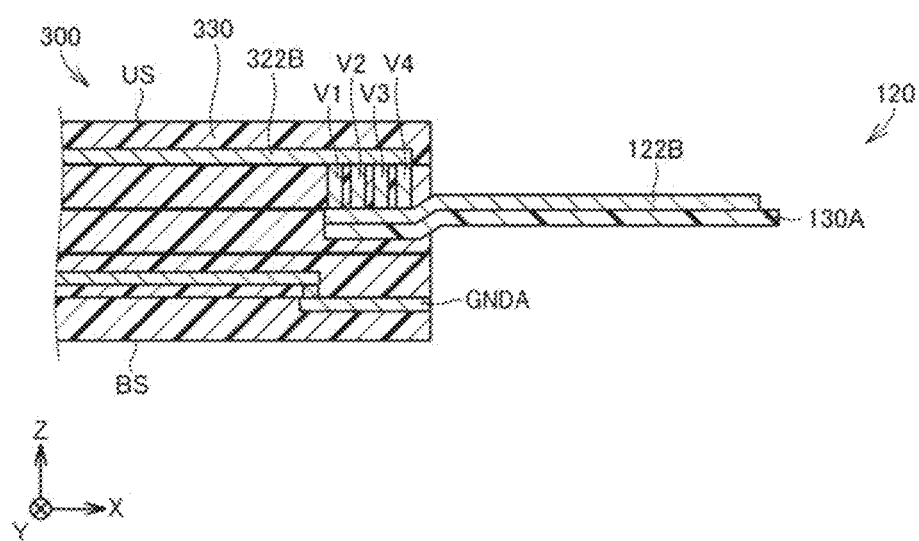
FIG. 12 is a diagram illustrating a structure for coupling an antenna substrate and a rigid substrate according to a second modification of Embodiment 3.

FIG. 12 is a diagram illustrating a structure for coupling an antenna substrate 120 and the rigid substrate 300 according to a second modification of Embodiment 3. In Modification 2 of Embodiment 3, the antenna substrate 120 and the rigid substrate 300 are coupled with a plurality of vias interposed therebetween.

With reference to FIG. 12, the vias V1 to V4 are located between an antenna electrode 122B and a wiring electrode 322B and couple the antenna electrode 122B and the wiring electrode 322B electrically and physically.

In Modification 2 of Embodiment 3, the physical strength of coupling between the antenna electrode 122B and the wiring electrode 322B is higher than in a case in which a single via couples the antenna electrode 122B and the wiring electrode 322B.

In addition, since the plurality of vias V1 to V4 are located between the antenna electrode 122B and the wiring electrode 322B, radio-frequency signals flow through a plurality of paths between the antenna electrode 122B and the wiring electrode 322B. This configuration improves the electrical coupling strength and also reduces the resistance of coupling between the antenna electrode 122B and the wiring electrode 322B. Although FIG. 12 illustrates a configuration in which the plurality of vias V1 to V4 are aligned in the X-axis direction, the plurality of vias may be aligned in the Y-axis direction.

Modification 3 of Embodiment 3

Figure 13:
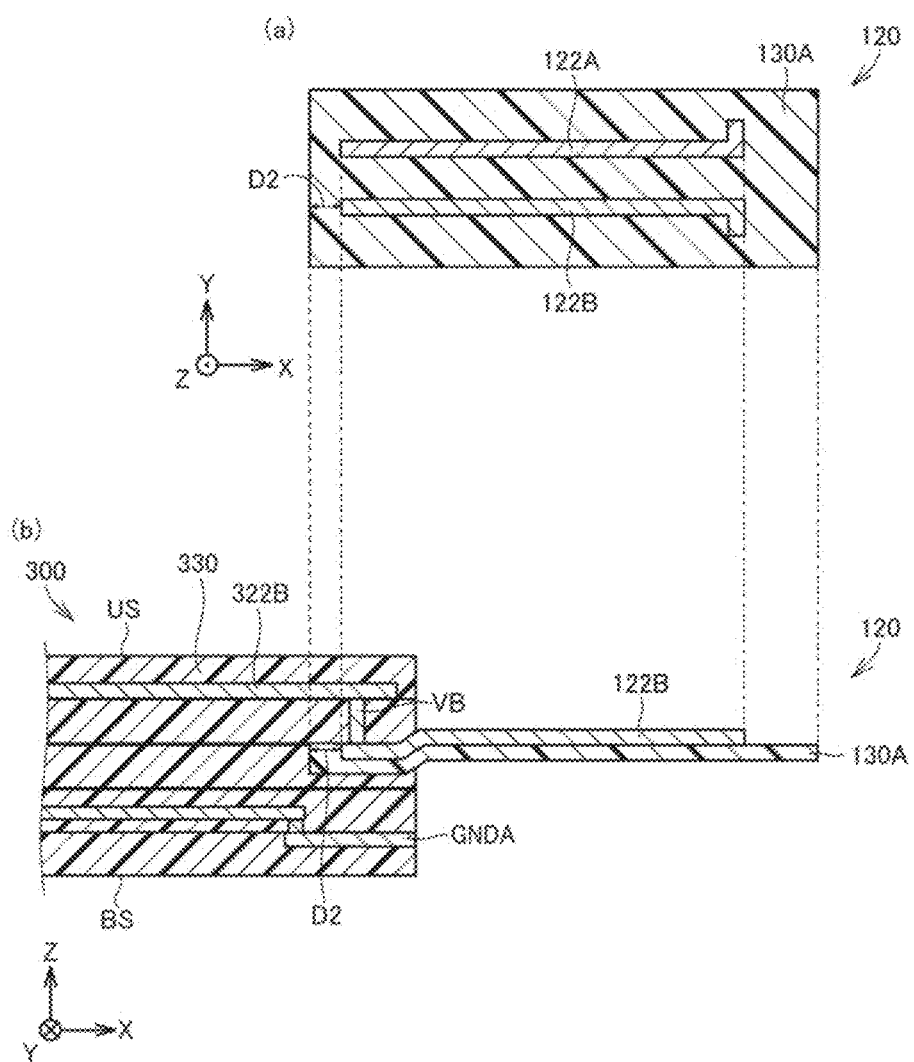
FIG. 13 is a diagram illustrating a structure for coupling an antenna substrate and a rigid substrate according to a third modification of Embodiment 3.

FIG. 13 is a diagram illustrating a structure for coupling an antenna substrate 120 and a rigid substrate 300 according to a third modification of Embodiment 3. FIG. 13 illustrates a plan view (FIG. 13(a)) of the antenna substrate 120 and a sectional view (FIG. 13(b)) of a structure for coupling the antenna substrate 120 and the rigid substrate 300.

In the coupling structure illustrated in FIG. 13, an antenna electrode 122B is located at a distance D2 from an end portion of a dielectric 130A in the negative X-axis direction. In other words, as illustrated in FIG. 13(a), the antenna electrodes 122A and 122B are located inside the outer peripheral end portions of the dielectric 130A in plan view in the positive the Z-axis direction.

With reference to FIG. 13(b), in a case in which a force is applied only to the dielectric 130A in the pulling-out direction, there is a possibility that the coupling between the dielectric 130A and the antenna electrodes 122A and 122B breaks, and only the dielectric 130A is pulled out because the antenna electrodes 122A and 122B are joined to vias.

To address such a case, the antenna electrode 122B is located at the distance D2 from the end portion of the dielectric 130A in the negative X-axis direction in the coupling structure illustrated in FIG. 13. When a force is applied only to the dielectric 130A, the area of the dielectric 130A corresponding to the distance D2 is caught by the antenna electrode 122B. Hence, this configuration prevents only the dielectric 130A from being cut and improves the strength of coupling between the antenna substrate 120 and the rigid substrate 300.

Embodiment 4

The above Embodiments 1 to 3 describe configurations in which the antenna substrate 120 serves as a dipole antenna. Embodiment 4 describes an example in which antenna substrates serve as a patch antenna.

Figure 14:
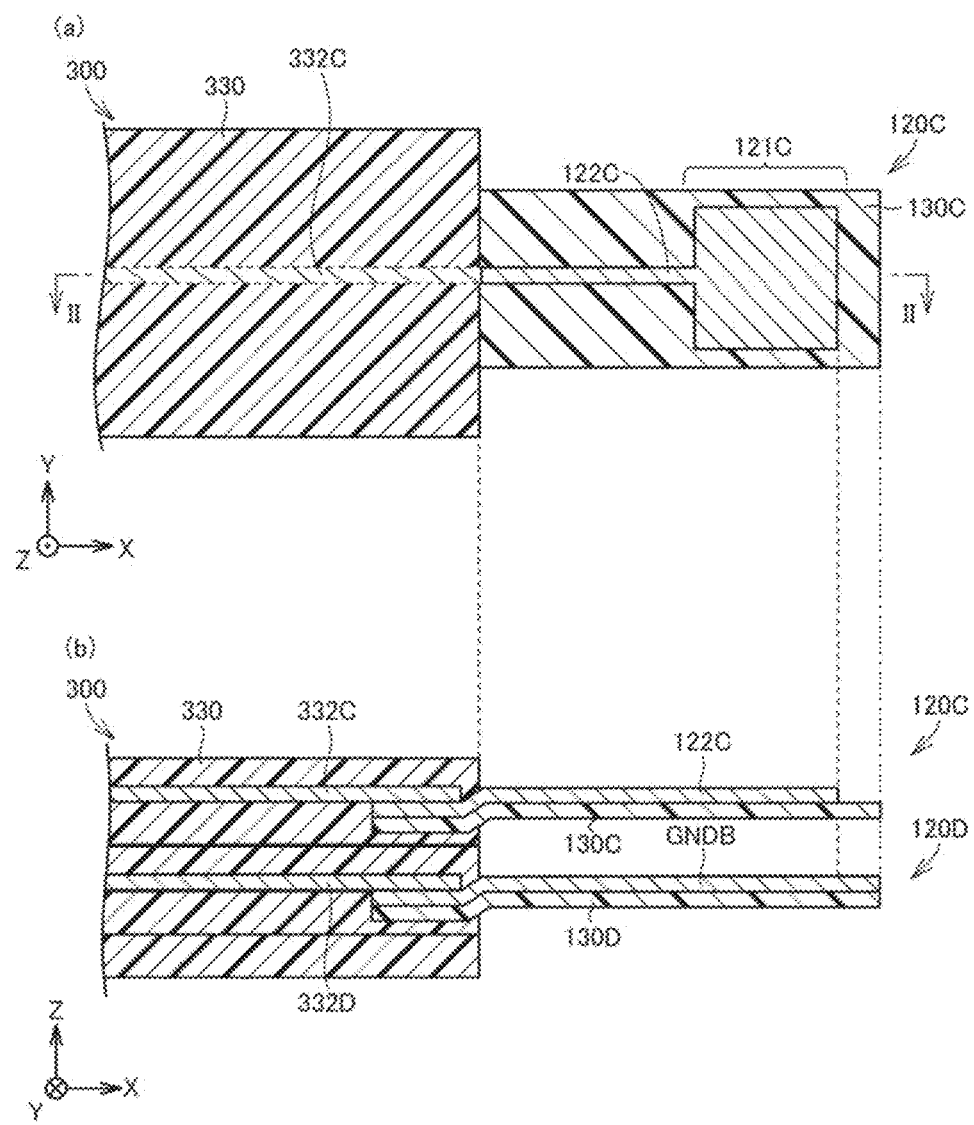
FIG. 14 is a diagram for explaining details of a structure for coupling an antenna substrate and a rigid substrate according to Embodiment 4.

FIG. 14 is a diagram for explaining details of a structure for coupling antenna substrates 120C and 120D and a rigid substrate 300 according to Embodiment 4. FIG. 14 illustrates a plan view (FIG. 14(a)) of a portion coupling the antenna substrate 120C and the rigid substrate 300 and a sectional view (FIG. 14(b)) taken along line II-II in FIG. 14(a). In Embodiment 4, repetitive description of the elements the same as or similar to those of Embodiments 1 to 3 is omitted.

With reference to FIG. 14, two substrates, which are the antenna substrate 120C and the antenna substrate 120D, are coupled to the rigid substrate 300. The antenna substrate 120C includes a dielectric 130C and an antenna electrode 122C. A square area of the antenna electrode 122C illustrated in FIG. 14(a) functions as a radiation electrode 121C of a patch antenna.

The antenna substrate 120D includes a dielectric 130D and a ground electrode GNDB. Specifically, the ground electrode GNDB functions as a ground electrode electrically coupled to the radiation electrode 121C of the patch antenna. In other words, in FIG. 14, the square area of the antenna substrate 120D and the area of the ground electrode GNDB overlapping the square area in plan view in the Z-axis direction form a patch antenna.

The rigid substrate 300 includes wiring electrodes 332C and 332D. The wiring electrodes 332C and 332D are electrically coupled to the antenna electrode 122C and the ground electrode GNDB, respectively.

As described above, the coupling structures described in Embodiments 1 to 3 can be used also between the antenna substrates 120C and 120D forming a patch antenna and the rigid substrate 300.

Embodiment 5

The above Embodiments 1 to 4 describe configurations in which the antenna substrate 120 serves as one antenna. Embodiment 5 describes an example in which a coupling structure of the present application is applied to an array antenna serving as a plurality of antennas.

Figure 15:
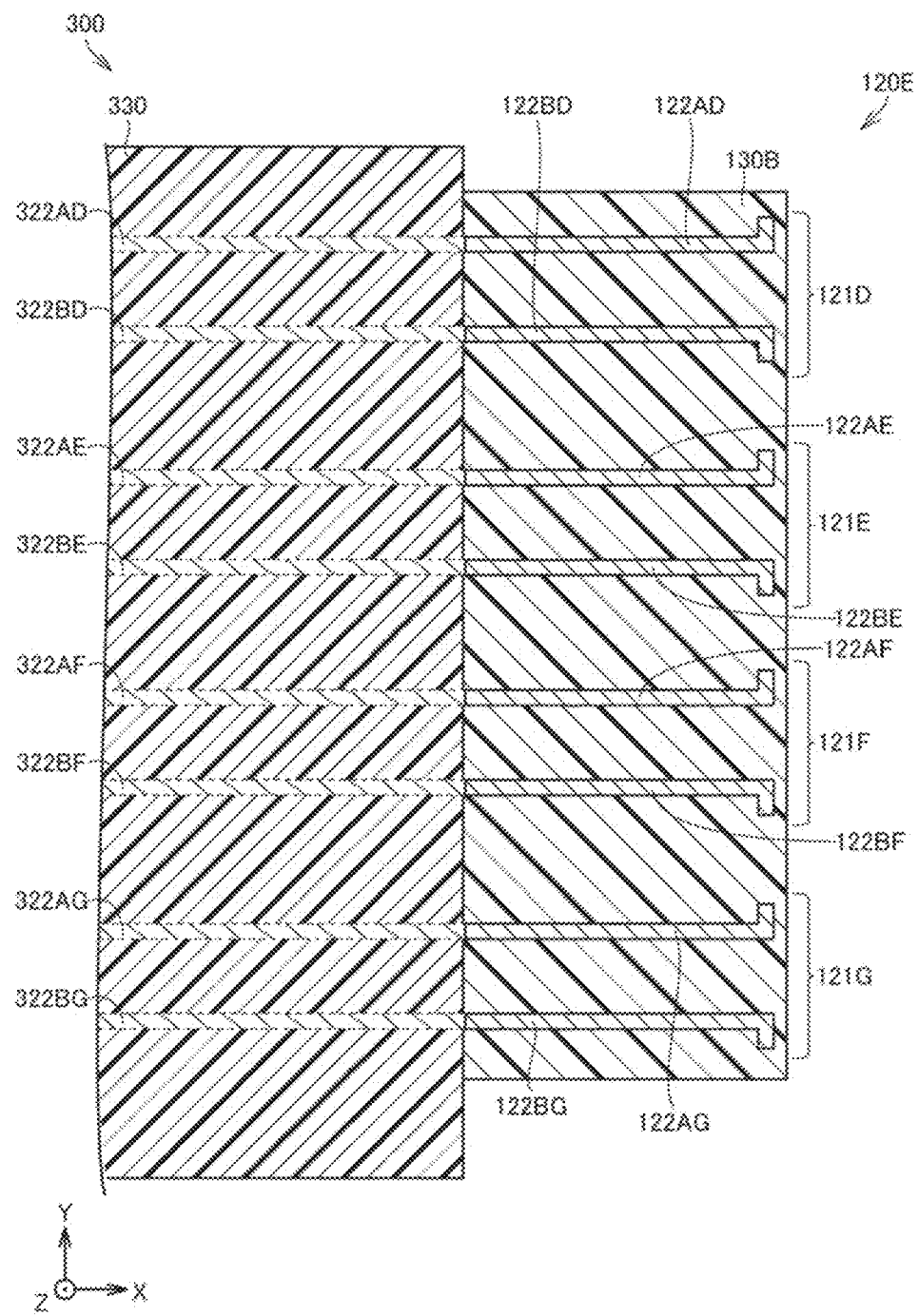
FIG. 15 is a diagram for explaining details of a structure for coupling an antenna substrate and a rigid substrate according to Embodiment 5.

FIG. 15 is a diagram for explaining details of a structure for coupling an antenna substrate 120E and a rigid substrate 300 according to Embodiment 5. FIG. 15 is a plan view of a portion coupling the antenna substrate 120E and the rigid substrate 300. In Embodiment 5, repetitive description of the elements the same as or similar to those of Embodiments 1 to 4 is omitted.

With reference to FIG. 15, the antenna substrate 120E includes a dielectric 130B and antenna electrodes 122AD, 122BD, 122AE, 122BE, 122AF, 122BF, 122AG, and 122BG. The rigid substrate 300 includes a dielectric 330 and wiring electrode 332AD, 332BD, 332AE, 332BE, 332AF, 332BF, 332AG, and 332BG. The antenna electrodes 122AD to 122BG are electrically coupled to the wiring electrodes 332AD to 332BG.

End portions of the antenna electrodes 122AD and 122BD in the positive X-axis direction function as a radiation electrode 121D. Specifically, the antenna electrodes 122AD and 122BD are differentially fed by the RFIC 110 and serve as a dipole antenna that radiates radio waves from the radiation electrode 121D. Similarly, the sets of the antenna electrodes 122AE and 122BE to 122AG and 122BG serve as dipole antennas that radiate radio waves from the respective radiation electrodes 121E to 121G.

As described above, the coupling structures illustrated in Embodiments 1 to 4 can be used also in a case in which the antenna substrate 120E is an array antenna serving as a plurality of antennas. Formation of the array antenna improves the antenna characteristics of the antenna substrate 120E. The array antenna included in the antenna substrate 120E may be composed of a plurality of patch antennas illustrated in FIG. 14.

Each of the antenna electrodes 122AE to 122AG and the antenna electrodes 122BE to 122BG corresponds to a third electrode in the present disclosure. Each of the wiring electrodes 322AE to 322AG and the wiring electrodes 322BE to 322BG corresponds to a fourth electrode in the present disclosure. Each of the radiation electrodes 121E to 121G corresponds to a third radiation electrode in the present disclosure.

Although FIG. 15 illustrates a configuration in which the antenna substrate 120E includes the antenna electrodes 122AD to 122AG and 122BD to 122BG, a configuration in which the antenna substrate 120E includes one antenna electrode serving as an array antenna is possible. Specifically, the antenna substrate 120E includes one antenna electrode coupled to one wiring electrode included in the rigid substrate 300. The one antenna electrode branches out in the antenna substrate 120E and forms radiation electrodes 121D to 121G.

This configuration reduces the number of wiring electrodes and antenna electrodes, which saves costs.

It should be considered that the embodiments in the present disclosure are examples in all respects and hence not restrictive. The scope of the present disclosure is defined not by the description of the above embodiments but by the claims and is intended to include all modifications within the scope of the claims and the equivalents thereof.

REFERENCE SIGNS LIST

10 COMMUNICATION DEVICE, 100 ANTENNA MODULE, 111A to 111D, 113A to 113D, 117 SWITCH, 112AR to 112DR LOW-NOISE AMPLIFIER, 112AT to 112DT POWER AMPLIFIER, 114A to 114D ATTENUATOR, 115A to 115D PHASE SHIFTER, 116 MULTIPLEXER/DEMULTIPLEXER, 118 MIXER, 119 AMPLIFIER CIRCUIT, 120, 120C to 120E ANTENNA SUBSTRATE, 121, 121C to 121G RADIATION ELECTRODE, 122A, 122B, 122C, 122AD to 122BG ANTENNA ELECTRODE, 130, 130A to 130D, 330 DIELECTRIC, 300 RIGID SUBSTRATE, 322A, 332C, 332D, 322AD to 332BG WIRING ELECTRODE, A1 AREA, BS BOTTOM SURFACE, US UPPER SURFACE, D1, D2 DISTANCE, G1 CONDUCTIVE ADHESIVE, GND, GNDA, GNDB GROUND ELECTRODE, H, H1, H1A, H2 RECESS, IC1, IC2 ELECTRONIC COMPONENT, II, III LINE, V1, V2, V3, V4, VB VIA

The invention claimed is:

1. A coupling structure for coupling a first substrate and a second substrate to each other, the coupling structure comprising a first substrate and a second substrate, wherein
the first substrate includes a first dielectric and a first electrode,
the second substrate includes a second dielectric and a second electrode, the second dielectric including a plurality of laminated dielectric layers,
the first electrode is electrically coupled to the second electrode,
the second dielectric includes a first surface and a second surface that are perpendicular to a lamination direction of the second dielectric,
the second dielectric holds the first dielectric, part of the first dielectric being located between the first surface and the second surface, and
the first electrode has a first recess an area of which overlaps the second electrode in plan view in the lamination direction, such that the first electrode extends downward in the lamination direction while extending inward into the second substrate.

2. The coupling structure according to claim 1, wherein
the second substrate further includes a ground electrode,
the ground electrode has a second recess an area of which overlaps the first electrode and the second electrode in plan view in the lamination direction, and
the second recess is recessed in a same direction as the first recess.

3. The coupling structure according to claim 2, wherein the ground electrode includes
a first ground electrode that overlaps the first electrode and the second electrode in plan view in the lamination direction and
a second ground electrode that does not overlap the first electrode and the second electrode in plan view in the lamination direction, and
each of the first ground electrode and the second ground electrode is located in a different dielectric layer of the plurality of dielectric layers included in the second dielectric.

4. The coupling structure according to claim 3, wherein
the second substrate further includes an electronic component, and
the electronic component is mounted in an area of the second surface, the area not overlapping the first dielectric in plan view in the lamination direction.

5. The coupling structure according to claim 3, wherein
the second substrate further includes an electronic component, and
the electronic component is mounted in an area of the second surface, the area not overlapping the second recess in plan view in the lamination direction.

6. The coupling structure according to claim 5, wherein the first electrode is in direct contact with the second electrode.

7. The coupling structure according to claim 5, further comprising
a conductive adhesive located between the first electrode and the second electrode and coupling the first electrode and the second electrode to each other.

8. The coupling structure according to claim 5, further comprising
   at least one via coupling the first electrode and the second electrode to each other.

9. The coupling structure according to claim 8, wherein
   the first electrode is located inside an outer peripheral end portion of the first dielectric in plan view in the lamination direction.

10. The coupling structure according to claim 9, wherein
    the first electrode has a mesh shape in plan view in the lamination direction.

11. The coupling structure according to claim 10, wherein
    the first dielectric has a light transmitting property.

12. An antenna module comprising the coupling structure according to claim 11, wherein
    part of the first electrode serves as a first radiation electrode for radiating radio waves.

13. The antenna module according to claim 12, wherein
    the first radiation electrode is part of a dipole antenna.

14. The antenna module according to claim 12, wherein
    the first radiation electrode is part of a patch antenna.

15. The antenna module according to claim 14, wherein
    part of the first electrode serves as a second radiation electrode different from the first radiation electrode.

16. The antenna module according to claim 14, wherein
    the first substrate further includes a third electrode,
    the second substrate further includes a fourth electrode,
    the third electrode is electrically coupled to the fourth electrode, and
    part of the third electrode serves as a third radiation electrode for radiating radio waves.

17. The coupling structure according to claim 2, wherein
    the second substrate further includes an electronic component, and
    the electronic component is mounted in an area of the second surface, the area not overlapping the first dielectric in plan view in the lamination direction.

18. The coupling structure according to claim 2, wherein
    the second substrate further includes an electronic component, and
    the electronic component is mounted in an area of the second surface, the area not overlapping the second recess in plan view in the lamination direction.

19. The coupling structure according to claim 18, further comprising
    a conductive adhesive located between the first electrode and the second electrode and coupling the first electrode and the second electrode to each other.

20. The coupling structure according to claim 18, further comprising
    at least one via coupling the first electrode and the second electrode to each other.

* * * * *